United States Patent
Katz et al.

[11] Patent Number: 5,508,144
[45] Date of Patent: Apr. 16, 1996

[54] PROCESS FOR FABRICATING A DEVICE

[75] Inventors: Howard E. Katz, Summit; Gary N. Taylor, Bridgwater, both of N.J.

[73] Assignee: AT&T Corp., Murray Hill, N.J.

[21] Appl. No.: 492,875

[22] Filed: Jun. 20, 1995

Related U.S. Application Data

[63] Continuation of Ser. No. 153,731, Nov. 19, 1993, abandoned.

[51] Int. Cl.$^6$ ........................................... G03F 7/26
[52] U.S. Cl. ..................... 430/296; 430/313; 430/314; 430/315; 430/323; 430/325; 430/942; 430/966; 430/967; 156/628.1; 156/643.1
[58] Field of Search ................................. 430/296, 313, 430/314, 315, 323, 325, 942, 966, 967; 156/628, 643

[56] References Cited

U.S. PATENT DOCUMENTS

| | | | |
|---|---|---|---|
| 4,532,186 | 7/1985 | Shibagaki | 428/457 |
| 4,702,792 | 10/1987 | Chow | 430/313 |
| 4,981,770 | 1/1991 | Taylor | 430/313 |
| 5,215,867 | 6/1993 | Stillwagon | 430/325 |

OTHER PUBLICATIONS

G. N. Taylor, et al., "At-the-Surface Schemes for Microstructure Fabrication in Polymer Films," presented at the 51st Industrial Affiliates Symposium on Chemistry, Photonics and Electronics, Stanford University, Stanford, CA., Dec. 7, 1992.

*Primary Examiner*—Kathleen Duda
*Attorney, Agent, or Firm*—Richard J. Botos

[57] ABSTRACT

The invention is directed to a process for fabricating an integrated circuit. An imaging layer is deposited on a substrate. The imaging layer is an energy sensitive resist material. The energy sensitive resist material contains moieties that preferentially bind to refractory material. A latent image of a pattern is introduced into the imaging layer by patternwise exposing the imaging layer to energy. The patternwise exposure introduces a selectivity into the resist material that is exploited to bind refractory material preferentially to either the exposed resist material or the unexposed resist material, but not both. The refractory material forms an etch mask over the resist material to which it preferentially binds. This etch mask is then used to transfer a pattern that corresponds to the latent image into the substrate.

22 Claims, No Drawings

PROCESS FOR FABRICATING A DEVICE

This application is a continuation of application Ser. No. 08/153,731, filed Nov. 19, 1993, now abandoned.

FIELD OF THE INVENTION

The invention is directed to the fabrication of integrated circuits and the like devices, and in particular, fabrication using lithographic processes.

ART BACKGROUND

Design rules for integrated circuit fabrication are becoming increasingly fine. Design rules of 0.5 µm are being replaced by design rules that are less than 0.5 µm. These increasingly fine design rules require processes which can delineate features in the integrated circuit with the required accuracy.

Lithographic processes are used during the fabrication of integrated circuits. A lithographic process employs energy that is introduced onto selected portions of an energy sensitive resist material (imaging layer) overlying a substrate. One way in which energy is introduced into selected portions of the resist is through openings in a mask substrate interposed between the energy source and the resist material. These openings in the mask substrate define the pattern. The pattern is transferred into the resist material by the energy that is permitted to pass through the openings in the mask substrate and into the resist. Thus, it is an image of the pattern defined by the mask substrate that is transferred into the resist material.

After the image is transferred into the resist material, the resist material is developed to form a pattern. The pattern is then transferred by etching into the substrate underlying the resist material. Once the pattern is incorporated into the substrate, it becomes a feature of the integrated circuit.

The energy used to expose the resist material, the composition of the resist material, the thickness of the resist material, and many other factors affect the ability of a lithographic process to delineate a feature in a substrate. The smaller the design rule, the more precisely the feature must be delineated.

Current lithographic processes use solution-developed resist materials. However, as design rules decrease to 0.25 µm, 0.18 µm, and smaller, lithographic processes that use dry-developed resists are becoming more attractive. Although lithographic processes that use dry-developed resists usually have more processing steps, these processes offer certain advantages when used for fabricating devices subject to these smaller design rules. These advantages include minimized linewidth variations over topography and enhanced depth of focus. Processes that utilize dry-developed resists offer these advantages because the image is transferred into the surface of the imaging layer, not throughout its entire thickness. Thus, the active region in which the image is focussed is not necessarily the entire thickness of the imaging layer. A thinner lithographically active region is advantageous because it is easier to precisely introduce the image into a thinner region.

Processes that use these dry-developed resists are referred to as surface-imaging lithographic processes. The processes are so named because they permit the image to be introduced near the surface of the resist. Surface-imaging lithographic processes also provide the promise of higher resolution patterns and the elimination of the need for an antireflective coating.

Because the dry-developed resists have a thinner lithographically active region, they must also have greater development selectivity between the exposed and unexposed regions of the resist layer than thicker conventional resists. Consequently, surface-imaging lithographic processes which introduce the requisite etch selectivity into the dry-developed resists used in these processes are being investigated.

SUMMARY OF THE INVENTION

In the process of the present invention, the etch selectivity between the exposed and unexposed areas of the resist material used in the surface-imaging lithographic process is provided by forming self-assembled layers of refractory material on either the exposed or unexposed areas of the resist material, but not both. Depositing these layers of refractory material on one of the two areas of the resist material provides sufficient etch selectivity between the two areas to permit a pattern to be developed in the substrate beneath the surface-imaging resist material.

In the present lithographic process, an imaging layer is first deposited on a substrate. In a surface-imaging process, a latent image is transferred into the surface of this imaging layer and not throughout the thickness of the imaging layer. The term "imaging layer," when used, refers to the entire layer and not just that portion of the layer into which the latent image is transferred. The imaging layer contains an energy sensitive polymeric resist material.

The polymeric resist material in the imaging layer has certain moieties attached thereto. These moieties are referred to as reactive groups when they are susceptible to reaction with other moieties under certain conditions. In some instances, the resist material has certain moieties attached thereto which, when irradiated, become the desired reactive group. In other instances, radiation causes a moiety with a desired reactivity to change into a moiety that does not have the requisite reactivity.

The reactive groups are selected for their susceptibility to react with a reagent containing a refractory material, a ligand for a refractory material, a host for a refractory material, etc. Such reaction binds the refractory material to the polymeric resist material. The polymeric resist material is energy sensitive. When the polymeric resist material is exposed to energy, it becomes chemically distinct from the polymeric resist material that is not exposed to energy. The chemical distinctness between the polymeric resist material that is exposed to energy and the polymeric resist material that is not exposed to energy is exploited to introduce a selectivity between the unexposed and exposed polymeric resist material. In the process of the present invention, the unexposed polymeric resist material is chemically distinct from the exposed polymeric resist because the reactive groups described above are present in substantially greater numbers in one of either the exposed portion or the unexposed portion of the polymeric resist material than in the other portion. When the polymeric resist material is contacted with the refractory material, more of the refractory material binds to the polymeric resist material with the greater concentrations of reactive groups. Etch selectivity is provided because the portion of the polymeric resist material with the greater concentration of refractory material bound thereto is more etch resistant than the other portion of the polymeric resist material.

Radiation induces the desired chemical change in the polymeric resist material either directly or via a photogenerated catalyst in the imaging layer. The chemical change renders the resist material susceptible to binding a refractory material if it was not so susceptible prior to its being exposed to radiation. In the alternative, radiation will passivate the resist material, thereby rendering it not susceptible to binding the refractory material to the resist material. In certain instances, heat is used in conjunction with radiation to either activate or passivate resist material for the desired reaction.

The imaging layer is patternwise exposed to radiation. Patternwise exposure means that a certain portion of the resist material in the imaging layer is exposed to radiation while another portion of the resist material is not exposed to radiation. This patternwise exposure introduces a latent image into the resist material.

The layer of refractory material is then assembled onto either the exposed or the unexposed area of the resist material. The refractory material is provided in a form that facilitates binding with the reactive groups on the resist polymer in the desired area of the resist. Refractory materials such as aluminum, chromium, iron, cobalt, nickel, zirconium, molybdenum, tungsten, bismuth, antimony, and ions and clusters of these elements are contemplated as suitable refractory materials for binding to the polymer surface.

In one example, zirconium, is bound to the resist material in one of either the exposed or the unexposed portions of the resist material. The imaging layer is contacted with a solution of zirconium oxychloride dissolved in a polar solvent such as water, methanol or ethanol. The solution is applied onto the imaging layer by any suitable technique such as puddling, immersion, or spraying.

To introduce the desired etch selectivity into the resist, multiple applications of the refractory material are contemplated. The multiple applications of refractory material are linked together by applying a reactant which links succeeding applications of the refractory material together. Pyrophosphoric acid ($H_4P_2O_7$) is an example of such a reactant. Pyrophosphoric acid is advantageous for binding transition metals together.

In the above example, succeeding applications of zirconium are bound together by introducing an aqueous solution of pyrophosphoric acid into contact with the imaging layer between the succeeding applications of the zirconium oxychloride solution. Each application of zirconium oxychloride followed by an application of pyrophosphoric acid is a cycle that deposits zirconium on the desired area of the resist. It is advantageous for the cycle to be repeated at least 30 times, which provides sufficient zirconium on the desired area of the resist to introduce the desired degree of selectivity into the resist.

The coated substrate is immersed in the zirconium oxychloride solution for a length of time that permits the metal to deposit on the desired discrete areas of the imaging layer. A suitable length of time is about 2 minutes to about 5 minutes. The coated substrate is then rinsed in a polar solvent such as water to remove any unbound zirconium oxychloride from the surface of the coated substrate. The coated substrate is then preferably immersed in an aqueous solution of pyrophosphoric acid for a length of time that is sufficient to permit the pyrophosphate to bind to the zirconium previously bound to the polymer. The coated substrate is then rinsed to remove the excess pyrophosphoric acid before the next deposition cycle is commenced.

The pattern formed by exposing the polymeric resist to energy and depositing refractory material on the polymeric resist as described above is then developed by reactive ion etching (RIE). Other suitable means for etching the pattern in the resist are contemplated, however, and these methods are known to those skilled in the art. If RIE is the method chosen for etching the pattern, then the gaseous plasma used for the etch is preferably an oxygen plasma. The pattern is then transferred into the substrate using conventional means.

DETAILED DESCRIPTION

The process of the present invention is directed to processes for device fabrication using surface imaging lithography. In surface imaging lithography an image is transferred into the near-surface portion of the imaging layer. The image is developed, after which it is transferred into the substrate on which the layers are deposited. The imaging layer has a thickness of about 0.1 microns to about 1 micron.

These thin imaging layers are made of polymeric resist materials that are energy sensitive. Exposing discrete areas of the imaging layer to radiation, e.g. light or discrete particles, induces a chemical change in polymeric resist material in the exposed areas. This chemical change is exploited to develop a pattern from the image defined by the exposed and the unexposed areas of the imaging layer.

The imaging layer is deposited on a substrate, after which the imaging layer is patternwise exposed to radiation. The patternwise exposure provides two discrete areas in the resist, the unexposed area and the exposed area. The two discrete areas together define a latent image of the pattern introduced into the resist by the patternwise exposure.

Numerous conventional resist polymers are contemplated as suitable in the process of the present invention. These resist polymers include phenolic resins, which are thermosetting resins that are the condensation product of phenol or substituted phenols with aldehydes such as formaldehyde, acetaldehyde and furfural. Resist polymers with amide functional groups pendant to the polymer backbone are also contemplated. Poly(acrylamide) is one example of such a resist polymer. Resist polymers with carboxyl groups that are pendant to the polymer backbone are also contemplated. The carboxyl groups are either pendant to the resist polymer when the resist material that contains the polymer is applied to the substrate or they are generated during the lithographic process by irradiation or post exposure processing. Examples of suitable resist polymers that contain carboxyl functional groups are polyacrylic acid, poly(itaconic acid), polymers that contain fumaric acid, or maleic acid and their associated ester precursors. Resist polymers that have phosphonate or phosphate groups pendant to the polymer backbone or attached to groups pendant to the polymer backbone are also contemplated as useful in the process of the present invention. These polymers are described in U.S. application of Houlihan-Katz-Schilling 9-7-6, which is filed concurrently herewith and is hereby incorporated by reference.

The resist polymers described above are combined with other materials to form a resist material. The resist material so formed is applied as an imaging layer onto a substrate using conventional methods for depositing such materials that are well known to those skilled in the art. The imaging layer is then patternwise exposed to radiation. The patternwise exposure introduces a latent image into the imaging layer. Preferably, the wavelength of the radiation used to expose the imaging layer is 193 nm, although other wavelengths of radiation such as soft x-ray (5 nm to 40 nm) and other radiation types such as electron radiation and ion radiation are also contemplated.

The process of the present invention contemplates binding a refractory material onto the imaging layer. The refractory material is intended to function as an etch mask which enables the latent image introduced into the imaging layer to be developed and transferred into the substrate. Therefore, in order for the refractory material to perform its desired function, it must be deposited on the imaging layer in a manner that conforms to the latent image. This selective deposition is accomplished by providing the functional groups described above on the resist polymers in the imaging layer. However, these functional groups will bind to the refractory material only in one of either the area of the resist material that is exposed to radiation, or the area of the resist that is not exposed to radiation. It is contemplated that this selective reactivity will be introduced into the resist material in a number of different ways.

The desired selectivity is introduced into an imaging layer by "protecting" the reactive functional group in the resist polymer. A functional group is protected when another moiety is attached to it which prevents the functional group from reacting. Once the protecting moiety is removed, the functional group is free to react. The protecting moieties are removed under conditions which strip the moieties from the polymer but do not otherwise substantially effect the polymer.

Typically, the moieties are stripped from the polymer in the presence of acid. Moieties stripped from the polymer under acidic conditions are commonly referred to as being acid labile. By adding a photoacid generator (PAG) to the resist polymer, the acid is generated only in those portions of the imaging layer that are exposed to radiation. Suitable PAGs are disclosed in U.S. Pat. No. 4,996,136, which is hereby incorporated by reference. Removing the protecting groups renders the deprotected moieties susceptible to binding the refractory material.

The desired selectivity is also introduced into the imaging layer by oxidizing certain areas of the resist which correspond to the latent image introduced into the imaging layer. For example, phenolic polymers do not directly bind to positive transition metal ions such as zirconium. However, if the phenolic polymer is subjected to photolysis at 193 nm in air, the hydroxyl moieties in the phenolic polymer undergo oxidation, and carboxylic acid moieties are formed on the polymer. Sufficient carboxylic acids are not formed on polymers that are less easily oxidized than phenol under the same conditions.

In the polymers described above, carboxylic acid functional groups (—COOH) are contemplated as suitable for binding the refractory material to the imaging layer. These functional groups are provided on the phenolic resin polymers in the manner described above. These functional groups are also generated on the resist polymer after the resist polymer has been exposed to radiation and baked. For example, poly(tetrahydropyranyl-4-styrenecarboxylate) is a resist polymer wherein the carboxyl functionality is masked by a tetrahydropyranyl moiety and removed by acid generated from a PAG when the polymer is exposed to radiation. After the t-hydropyranyl moiety is removed, the carboxyl moiety will bind to the refractory material. Another example of this type of polymer is the bis-(tetrahydropyranyl ester) of poly(itaconic acid).

Another example of a resist polymer with carboxyl functional groups that bind refractory metal to the polymer is poly(acrylic acid) (PAA). Also, carboxylic acid moieties are generated on certain polymers by photolysis of phenolic moieties as described above and by cleaving the tetrahydropyranyl and t-butyl groups from poly(tetrahydropyranyl acrylate) and poly(t-butyl acrylate), respectively in the presence of a PAG.

Amides are another functional group used to bind refractory metals to the polymers in the present invention. Similar to the deprotection mechanisms described generally above, a polymer with amide groups attached to the polymer backbone is incorporated into a resist material. For example, a resist material containing poly(methacrylamide) is applied as an imaging layer onto a substrate. A latent image is introduced into the imaging layer by a patternwise exposure to 193 nm radiation, which oxidizes the amide side chain to provide methacrylic acid side chains on the polymer. These methacrylic side chains do not bind zirconium or other refractory materials because the side chain is oriented such that the methyl group is at the surface. The amide functional groups in the areas of the imaging layer that were unexposed to radiation are not so oxidized and are then able to bind refractory metal to the polymer. Therefore, the ability of the polyamide to bind to the refractory material is destroyed by exposing the polyamide to radiation.

Imide-containing polymers are also contemplated for use in the present process. The imide functional group in the resist polymer does not bind to refractory materials. Upon photooxidation, carboxylic acid groups are formed. Amine-based polymers such as poly(ethyleneimine) that have acid-sensitive t-butoxycarbonyl groups pendant to the amine moiety which mask the amine functionality are also contemplated to be used in the process of the present invention. When the polymer is irradiated in the presence of PAG, the t-butoxycarbonyl groups are stripped from the amine moieties. The free amine moieties are then able to bind with the refractory material.

A deprotection mechanism as described above is also used when resist materials with polymers having pendant phosphonate or phosphate groups are used. Acid labile or photolabile groups are attached to the phosphate or phosphonate groups. The acid labile groups or photolabile groups are stripped from the polymer under certain conditions which depend upon the specific acid labile or photolabile group and the polymer to which these groups are bound. The unprotected phosphonate or phosphate groups are then free to bind to a refractory material.

Polymers which have more than one functional group which will bind to a refractory material per repeat unit of the polymer are also contemplated for use as polymeric resist materials for use in the present process. These polymers include the poly(itaconates), which have two carboxyl groups per repeating unit and the poly(styrene dicarboxylates).

These poly(itaconates) are represented by the general structure:

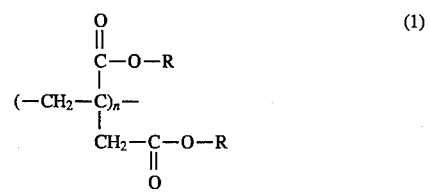

(1)

R is representative of the protective groups described generally above. Typically, these groups are stripped from the polymer when it is exposed to radiation (photolabile) or in the presence of acid (acid labile).

A styrene polymer which has multiple carboxyl groups per repeating unit, poly(styrene-3,4,-dicarboxylic anhydride) or other protected diester thereof, is also contemplated as a resist polymer in the process of the present invention. Other polymers include copolymers of methyl vinyl ether and fumarate or maleate esters. The maleate and fumarate esters also contain multiple carboxyl groups per repeating unit. These polymers are represented by the general formula:

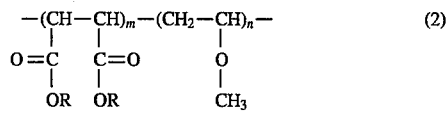

(2)

wherein the description of R is the same as in the previous paragraph.

If a surface carboxyl or other functional group on the polymer is reacted with a branched binding enhancer having multiple binding groups, it is possible to bind more refractory metal to the surface of the imaging layer. This branched binding group is depicted by the structure —A—Y(R—Z)$_n$ in which A is a reactive group bound via a covalent, ionic, or coordinating bond to the polymer surface. Y is a central atom or anchoring group to which the branched functional groups are attached. The branching groups (R—Z) are tethered to Y via a bond between Y and R. The terminal group Z is selected from those above-enumerated functional groups that have a strong binding attraction to the refractory material which is bound to the polymer surface to introduce the desired etching selectivity into the imaging layer. Examples of such branched binding groups are

In these groups NH$_2$ is the anchoring group (A) and the tetrasubstituted carbon is tethering group (Y). The branching groups (R—Z) are alkanecarboxylic acid or alkaneamide moieties that strongly bind with the refractory material.

These branched binding groups are derived from nitromethane. One skilled in the art will recognize how to incorporate these reactive groups into the previously described resist polymers.

Not only must the resist polymer have functional groups that bind the refractory material to the polymer surface, the functional groups must be oriented on the polymer such that they are in a position to bind to the refractory material. For example, the x-ray photoelectron spectroscopy (XPS) spectra at 20° of two resist polymers, poly(methacrylic acid) (PMAA) and poly(acrylic acid) (PAA) showed that PMAA had a higher carbon concentration on its surface than indicated by its stoichiometry. PAA was observed to have a surface carbon concentration that was consistent with its stoichiometry. PMAA was observed not to bind the refractory material, although it has almost as many carboxyl groups per molecule as PAA, which was observed to bind Zr quite well. A contemplated explanation for this observation is that the methyl groups on the PMAA are oriented toward the polymer surface to minimize surface energy, and the carboxyl groups are oriented away from the polymer surface. PAA has no methyl groups and, therefore, more of its carboxyl groups are oriented toward the polymer surface. Thus, not only must the resist polymers have suitable functional groups, those functional groups preferably are oriented toward the polymer surface and are available to bind to the refractory material.

The layer of refractory material is then assembled onto either the exposed or the unexposed area of the resist material. The refractory material is provided in a form that facilitates binding the refractory material to the functional groups on the resist polymer. Refractory materials such as aluminum, chromium, iron, cobalt, nickel, zirconium, molybdenum, tungsten, bismuth, antimony, and ions and clusters of these elements are contemplated as suitable refractory materials for binding to the polymer surface. Zirconium has been found to be advantageous. The process also contemplates binding metal-containing clusters such as phosphotungstate $P_2W_{18}O_{62}^{-6}$, a hexanion, and phosphomolybdate, $P_2Mo_{18}O_{62}^{-6}$ to the desired portion of the imaging layer. The process of the present invention further contemplates binding metal oxide clusters such as $Ti_{16}O_{16}(OC_2H_5)_{32}$, $Mo_6Cl_8(CF_3SO_3)_6$, and $Zn_4O[(CO)_9Co_3CCOO]_6$ to the desired portion of the imaging layer.

Zirconium oxychloride reacts with the functional groups on the resist polymer to bind the metal to the polymer. Although zirconium oxychloride is mentioned specifically, solutions in which a zirconium salt is soluble at a pH of about 3 are contemplated suitable sources of zirconium for the process of the present invention. Zirconium salts such as zirconium nitrate and zirconium chloride are additional examples of suitable zirconium salts. The zirconium oxychloride is dissolved in a polar solvent such as water, methanol or ethanol. The concentration of zirconium oxychloride in the solution is about 0.001M to about 0.1M. It is advantageous if the concentration of the zirconium is about 0.005M to about 0.007M.

The solution is then applied onto the imaging layer by any suitable technique. The coated substrate is immersed in the zirconium oxychloride solution. The zirconium oxychloride is also puddled onto the imaging layer. The imaging layer is placed in contact with the zirconium oxychloride solution for a length of time that is sufficient for zirconium to bind to the desired discrete areas of the imaging layer. If an immersion technique is used, the coated substrate is immersed in the zirconium oxychloride solution for about 2 to about 5 minutes.

Refractory material is assembled on the polymeric resist material via successive applications. A reactant is used to bind succeeding applications of the refractory material together. The reactant binds succeeding applications together because it is capable of binding to two or more atoms or molecules of refractory metal. For example if X is a molecule of refractory material and Y is a molecule of the reactant, Y forms the link —X—Y—X— between two atoms or molecules of refractory material. An example of a material is a polyphosphoric acid such as pyrophosphoric acid. Coated substrate with the imaging layer thereon is deposited in an aqueous solution of pyrophosphoric acid between succeeding applications of a solution containing a refractory material such as the previously mentioned zirconium oxychloride. The coated substrate is immersed in an aqueous solution of pyrophosphoric acid for about 2 to about 5 minutes which is sufficient for the phosphate to bind to the zirconium previously bound to the polymer. The concentration of pyrophosphoric acid in the aqueous solution is about 0.005M to about 0.007M. This cycle is repeated 30 times to introduce the desired etch selectivity into the resist.

The coated substrate is preferably rinsed in a polar solvent after being immersed in solutions of zirconium oxychloride and pyrophosphoric acid. Such rinsing removes unbound traces of these reactants from the surface of the polymeric resist material but does not dissolve the polymer in the imaging layer. Thus, these unbound traces are prevented from accumulating on the surface of the polymeric resist material and interfering with the process of binding the refractory materials to the polymer surface.

After the desired amount of refractory material has been deposited on the substrate, the image in the polymeric resist is developed into a pattern. The pattern is preferably developed by plasma ion etching (RIE), although other suitable means for etching the pattern in the resist are contemplated, such as electron cyclotron resonance (ECR), electron stimulated etching, or ion stimulated etching. If RIE is the method chosen for etching the pattern, then the gaseous plasma used for the etch is preferably an oxygen plasma. The pattern is then transferred into the substrate using conventional means. Typically, in a helicon source etcher, $O_2$ RIE is conducted at 50° C. to −100° C. and 1–3 mTorr of $O_2$ at 100–300 sccm with a source power of 1000–2500 W and an RF bias of −20 V to 150 V.

The refractory material assembled on the polymer surface is so assembled in an anisotropic manner accompanied by less linewidth loss and less linewidth variation. Anisotropic assembly of the refractory mask permits steeper wall profiles during pattern development. Anisotropy is provided in the process of the present invention by the vertical assembly of molecular units on the polymer surface. Preferential bonding in the vertical direction also promotes anisotropy.

The following examples are intended to illustrate specific embodiments of the present invention and are not intended to limit the invention defined by the claims.

EXAMPLE 1: ASSEMBLY OF REFRACTORY MATERIAL ON A BILAYER RESIST

A layer of a photoresist material (SPR-1811; obtained from the Shipley Co. in Newton, Mass.) was spin-coated at 2000 rpm onto a silicon wafer (5 inch diameter). The coated wafer was heated to a temperature of 210° C. and held at that temperature for 5 minutes, which crosslinked the photoresist material. The thickness of the layer of crosslinked photoresist on the substrate was 870 nm.

A solution of poly(vinyl phenol) (10 percent by weight) in cyclopentanone was spin coated at 1000 rpm onto the coated substrate. The poly(vinyl phenol) had a molecular weight of 7000 g/mole and was obtained from Polysciences, Inc. of Warminster, Pa. The coated substrate was then heated to 108° C. and held at that temperature for 4 minutes.

The bilayer-resist-coated-wafer was then patternwise exposed using radiation with a wavelength of 193 nm. The radiation source was a Lambda Physik Argon-Fluoride (ArF)excimer laser at a fluence of 100 microwatt/$cm^2$/pulse. Forty regions of the bilayer resist coating were exposed to radiation dosages of about 2.5 mJ/$cm^2$ to about 102.5 mJ/$cm^2$. Each region had a size of about 5 mm by about 5 min.

The exposed, bilayer-resist-coated wafer was then immersed in a solution 0.005M of zirconium oxychloride, $ZrOCl_2$, for 2 minutes. The solution was at a temperature of about 23° C. The bilayer-resist-coated-wafer was rinsed by dipping the coated wafer in deionized water for 2 minutes.

The coated wafer was then immersed in an aqueous solution of pyrophosphoric acid (0.005M) for 2 minutes, after which the coated wafer was again immersed in deionized water for 2 minutes. The four step cycle (immerse in $ZrOCl_2$/rinse/immerse in pyrophosphoric acid/rinse) was repeated another 29 times for a total of 30 cycles. In this manner zirconium was selectively self-assembled on top of the exposed regions of the resist material. This self-assembly was confirmed by x-ray photoelectron spectroscopy and x-ray fluorescence measurements.

The coated wafer was then loaded into a Model 5410 Lucas- Signatone, Inc. plasma etching machine having source and bias 13.56 mHz RF power supplies. The coated wafer was etched in an oxygen plasma at a pressure of 2 mTorr and an $O_2$ flow rate of 85 sccm at 25° C. The etcher had a sample bias power of 120 W and a bias voltage of −65 V. The sample was etched for 50 seconds. Negative tone full thickness patterns were obtained at a dosage of about 85 mJ/$cm^2$ with good contrast.

EXAMPLE 2: ASSEMBLY OF A MULTILAYER REFRACTORY MATERIAL ON A BILAYER RESIST

A bilayer film of a hardened resist (SPR-1811, obtained from the Shipley Co.) was deposited on a silicon substrate and hardened as described in Example 1. The resulting film was 870 nm thick. The film was overcoated with a solution of resorcinol novolac resin (SD-562A which was obtained from the Borden Chemical Co. in Louisville, Ky.). The resorcinol novolac resin was in a solution of cyclopentanone that contained 15 percent by weight resorcinol novolac resin. The solution of resorcinol novolac resin was spin coated onto the coated wafer at 1000 rpm, after which the coated substrate was heated to a temperature of 108° C. and held at that temperature for about 2 minutes. The resorcinol novolac resin layer was 640 nm thick.

The bilayer coated wafer was then exposed to radiation as described in Example 1. The exposed, coated wafer was then immersed in successive solutions of $ZrOCl_2$ and pyrophosphoric acid. The coated wafer was rinsed after being immersed in these solutions as described in Example 1. The coated wafer was then etched as described in Example 1, except that the coating was etched for 55 seconds. Full thickness negative tone patterns were obtained at an energy dosage of 20 mJ/$cm^2$. The contrast was observed to be higher than the contrast observed in the poly(vinyl phenol) resist material used in Example 1.

We claim:

1. A process for fabricating a device comprising:

applying an imaging layer comprising an energy sensitive polymeric material onto a substrate;

exposing the imaging layer to radiation to form a first discrete area on the imaging layer in which the polymeric material has moieties pendant thereto which are susceptible to binding a refractory material and a second discrete region in the imaging layer in which the polymeric material contains significantly fewer of the moieties that are susceptible to binding a refractory material, the first discrete region and the second discrete region together defining a pattern;

contacting a first reagent containing the refractory material with the imaging layer thereby directly binding the refractory material to at least a portion of the moieties susceptible to binding the refractory material, thereby introducing the desired selectivity into the resist;

developing the pattern in the imaging layer from the image defined by the first and second discrete regions; and transferring the pattern in the imaging layer into the substrate.

2. The process of claim 1 further comprising removing the imaging layer from contact with the first reagent and contacting the imaging layer with a second reagent which comprises a moiety which is capable of binding to more than one refractory material species and wherein the steps of contacting the imaging layer with a first reagent and contacting the imaging layer with the second reagent are repeated one or more times prior to developing the imaging layer.

3. The process of claim 2 wherein the second reagent is a polyphosphoric acid.

4. The process of claim 3 wherein the polyphosphoric acid is pyrophosphoric acid.

5. The process of claim 4 wherein the pyrophosphoric acid is in an aqueous solution in which the concentration of pyrophosphoric acid is about 0.001M to about 0.05M.

6. The process of claim 2 further comprising rinsing the imaging layer after the imaging layer has been removed from contact with the first reagent and rinsing the imaging layer after the imaging layer has been removed from contact with the second reagent.

7. The process of claim 1 wherein the refractory material is selected from the group consisting of aluminum, chromium, iron, cobalt, nickel, zirconium, molybdenum, tungsten, bismuth., antimony, and ions and clusters of these elements.

8. The process of claim 7 wherein the refractory material contains zirconium.

9. The process of claim 8 wherein the reagent containing the refractory material is solution containing a zirconium salt.

10. The process of claim 9 wherein the zirconium salt is selected from the group consisting of zirconium oxychloride, zirconium chloride, and zirconium nitrate.

11. The process of claim 9 wherein the first reagent is a zirconium salt that is contacted with the imaging layer by immersing the substrate with the imaging layer coated thereon in a solution of zirconium salt for a time sufficient for zirconium to bind to a substantial portion of the first discrete area on the imaging layer.

12. The process of claim 1 wherein the first and second discrete areas are formed in the imaging layer by exposing the first discrete region to radiation with a wavelength of about 5 nm to about 300 nm.

13. The process of claim 1 wherein the first and second discrete areas are formed in the imaging layer by exposing the first discrete region to x-ray radiation with a wavelength of about 0.8 nm to about 1.4 nm.

14. The process of claim 1 wherein the first and second discrete areas are formed in the imaging layer by exposing the first discrete region to electron beam radiation.

15. The process of claim 1 wherein the first and second discrete areas are formed in the imaging layer by exposing the first discrete region to ion beam radiation.

16. The process of claim 1 wherein the pattern is developed by reactive ion etching in an oxygen plasma.

17. The process of claim 1 wherein the refractory material is bound anisotropically.

18. The process of claim 1 wherein the polymeric material is selected from the group consisting of polyamides, polycarboxylic acids, polyphosphonates and polyphosphates.

19. The process of claim 1 wherein the moieties are that are pendant to the polymeric material are selected from the group consisting of carboxyl, amide, phosphate and phosphonate.

20. A process for fabricating a device comprising:
applying an imaging layer comprising an energy sensitive polymeric material onto a substrate;
exposing the imaging layer to radiation to form a discrete area on the imaging layer in which the polymeric material has moieties selected from the group consisting of carboxyl, amide, phosphate and phosphonate moieties pendant thereto which are susceptible to binding a refractory material and a second discrete region in the imaging layer in which the polymeric material contains significantly fewer of the moieties that are susceptible to binding a refractory material, the first discrete region and the second discrete region together defining a pattern;
contacting the imaging layer with a solution of zirconium oxychloride,
developing the pattern imaging layer from the image defined by the first and second regions; and
transferring the pattern in the imaging layer into the substrate.

21. The process of claim 20 wherein the moieties are reacted with branched binding groups with a general structure —A—Y (R—Z)$_n$ in which A is the moiety pendant to the polymer surface, Y is a central atom to which a plurality of functional groups, R—Z, are bound, wherein R is selected from the group consisting of alkyl and alkylcarboxyl and Z is selected from the group consisting of carboxyl, amide, phosphate and phosphonate moieties and n is at least 2.

22. The process of claim 21 wherein Y is a carbon atom.

* * * * *